US008837238B2

(12) United States Patent
Matsumura et al.

(10) Patent No.: US 8,837,238 B2
(45) Date of Patent: Sep. 16, 2014

(54) SEMICONDUCTOR DEVICE HAVING A PLURALITY OF MEMORY MODULES

(75) Inventors: Masashi Matsumura, Itami (JP); Hiroyuki Motomura, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 240 days.

(21) Appl. No.: 13/345,411

(22) Filed: Jan. 6, 2012

(65) Prior Publication Data
US 2012/0185687 A1 Jul. 19, 2012

(30) Foreign Application Priority Data
Jan. 18, 2011 (JP) ................................ 2011-007836

(51) Int. Cl.
G11C 7/00 (2006.01)
G06F 1/32 (2006.01)
G11C 5/14 (2006.01)

(52) U.S. Cl.
CPC ........... *G06F 1/3206* (2013.01); *Y02B 60/1225* (2013.01); *G06F 1/3275* (2013.01); *G11C 5/148* (2013.01)
USPC ........... 365/194; 365/154; 365/191; 365/226; 365/229

(58) Field of Classification Search
USPC .......... 365/154 X, 191, 194 X, 226 X, 229 X, 365/154, 194, 226, 229
See application file for complete search history.

(56) References Cited

U.S. PATENT DOCUMENTS

| | | | | |
|---|---|---|---|---|
| 6,009,023 A * | 12/1999 | Lu et al. | ................... | 365/189.11 |
| 6,977,519 B2 * | 12/2005 | Bhavnagarwala et al. | ..... | 326/34 |
| 6,978,411 B2 * | 12/2005 | Huang et al. | ................... | 714/733 |
| 7,003,639 B2 * | 2/2006 | Tsern et al. | ................... | 711/154 |
| 7,196,950 B2 * | 3/2007 | Kanda et al. | ................... | 365/194 |
| 7,701,764 B2 * | 4/2010 | Nguyen | ................... | 365/185.11 |
| 7,894,294 B2 * | 2/2011 | Pyeon | ................... | 365/230.03 |
| 8,407,395 B2 * | 3/2013 | Kim et al. | ................... | 711/100 |
| 8,432,738 B2 * | 4/2013 | Nguyen | ................... | 365/185.11 |

FOREIGN PATENT DOCUMENTS

| | | |
|---|---|---|
| JP | 2001-156258 | 6/2001 |
| JP | 2007164822 A | 6/2007 |
| JP | 2007267162 A | 10/2007 |

OTHER PUBLICATIONS

Japanese office action issued in Japanese Application No. 2011-007836 dated Apr. 22, 2014, w/English translation.

* cited by examiner

*Primary Examiner* — Vanthu Nguyen
(74) *Attorney, Agent, or Firm* — McDermott Will & Emery LLP

(57) ABSTRACT

A semiconductor device which can reduce the peak value of the rush current generated during a transition from resume mode to normal mode. The semiconductor device has a plurality of daisy-chained memory modules. Each of the memory modules includes a memory array, a switch for controlling, in resume mode, source voltage supply to a constituent element of the memory module, and a delay circuit which receives a resume control signal ordering a transition from resume mode to normal mode and outputs a resume control signal delayed from the inputted resume control signal to the memory module of the next stage.

8 Claims, 20 Drawing Sheets

SEMICONDUCTOR DEVICE HAVING A PLURALITY OF MEMORY MODULES

CROSS-REFERENCE TO RELATED APPLICATIONS

The disclosure of Japanese Patent Application No. 2011-7836 filed on Jan. 18, 2011 including the specification, drawings and abstract is incorporated herein by reference in its entirety.

BACKGROUND

The present invention relates to a semiconductor device, particularly, to a semiconductor device having resume mode for operation with low power consumption.

Techniques for preventing a large current from flowing instantaneously through a semiconductor device have been proposed. Japanese Unexamined Patent Publication No. 2001-156258, for example, discloses a semiconductor integrated circuit which includes circuit blocks, function blocks for realizing a characteristic function effective when plural circuit blocks are provided, an input circuit, an output circuit, and a timing control circuit which, by frequency-dividing a clock signal, controls the timing of circuit block and function block operations synchronously in time division mode. The timing control circuit is configured to cause, when circuit blocks and function blocks are operated, the times when the currents instantaneously flowing between the power supply and ground potential become maximum to be phase-shifted between the circuit blocks and function blocks being operated.

SUMMARY

In Japanese Unexamined Patent Publication No. 2001-156258, however, no technique is disclosed for reducing the peak current flowing when operation returns from low-power-consuming resume mode to normal mode.

When an embedded SRAM is resume-controlled, only the memory array section thereof is applied with a minimum voltage required to retain the data stored therein and power supply to peripheral circuits not required to retain data is suspended. This allows the data stored in the memory array section to be retained using minimum voltage. Such a state where the data stored in a memory module is retained with a minimum current is referred to as "resume mode," whereas other states than the resume mode are referred to as "normal mode."

In recent years, logic large-scale integrated (LSI) circuits have been made operable with increasingly low power consumption and static random access memories (SRAMs) embedded in LSIs have been made larger in capacity. Also, mobile products offering resume mode (wait mode) have been increasing, and the number of memory modules of embedded SRAMs to be subjected to resume control and the capacities of such embedded SRAMs have been increasing. This, however, involves problems that the peak value of the rush current generated when a mobile product returns from resume mode to normal mode becomes larger making it difficult to securely retain data during operation with low voltage.

Hence, an object of the present invention is to provide a semiconductor device which can reduce the peak value of the rush current generated when returning from resume mode to normal mode.

A semiconductor device according to an embodiment of the present invention has a plurality of daisy-chained memory modules. Each of the memory modules includes a memory array, a switch for controlling, in resume mode, source voltage supply to a constituent element of the memory module, and a delay circuit which receives a resume control signal ordering a transition from resume mode to normal mode and outputs a resume control signal delayed from the inputted resume control signal to the memory module of the next stage.

According to an embodiment of the present invention, the peak value of the rush current generated when a semiconductor device returns from resume mode to normal mode can be reduced.

DETAILED DESCRIPTION

Embodiments of the present invention will be described below with reference to drawings.

First Embodiment (Semiconductor Chip)

Figure 1:
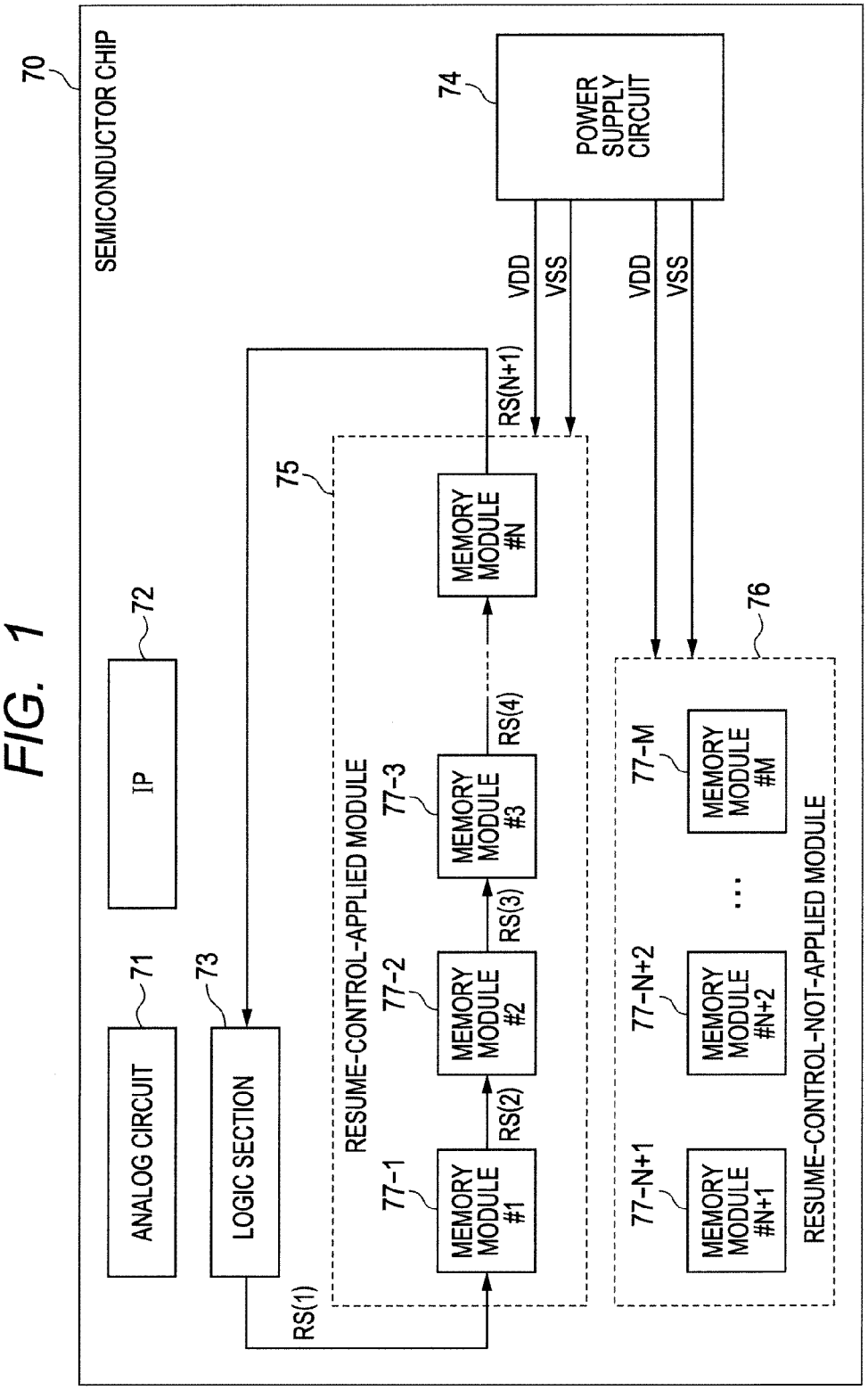
FIG. 1 shows a semiconductor chip configuration according to a first embodiment of the present invention.

FIG. 1 shows a semiconductor chip configuration according to a first embodiment of the present invention.

Referring to FIG. 1, a semiconductor chip 70 includes an analog circuit 71, intellectual property (IP) 72, a logic section 73, a resume-control-applied module 75, a resume-control-not-applied module 76, and a power supply circuit 74.

The analog circuit 71 processes analog signals for controlling constituent elements of the semiconductor chip 70.

The IP 72 is a peripheral circuit for executing, for example, a timer function and a communication function.

The logic section 73 outputs a resume control signal RS (1) to memory module #1 of the first stage included in the resume-control-applied module 75. The logic section 73 receives a resume control signal RS (N+1) from memory module #N of the last stage.

When the resume control signal RS (N+1) is received, the logic section 73 determines that the resume-control-applied module 75 has returned from resume mode to normal mode and starts accessing the resume-control-applied module 75.

When operating in resume mode, the power consumption of the resume-control-applied module 75 is low. The memory modules #1 to #N included in the resume-control-applied module 75 are daisy-chained.

Memory module #i receives a resume control signal RS (i) from memory module #i−1 of the preceding stage or from the logic section 73 and controls source voltage supply for the constituent elements thereof according to the resume control signal RS (i), while outputting a resume control signal RS (i+1) to memory module #i+1 of the next stage or to the logic section 73.

Memory modules #N+1 to #M included in the resume-control-not-applied module 76 are provided with a source voltage in resume mode, too, as in normal mode.

The power supply circuit 74 provide source voltages to constituent elements of the semiconductor chip 70. The semiconductor chip 70 is used in a mobile product such as a cellular phone. For example, when a cellular phone incorporating the semiconductor chip 70 is folded after a moving image application is executed, the logic section 73 outputs a resume control signal RS (1).

(Memory Modules Included in Resume-Control-Applied Module)

Figure 2:
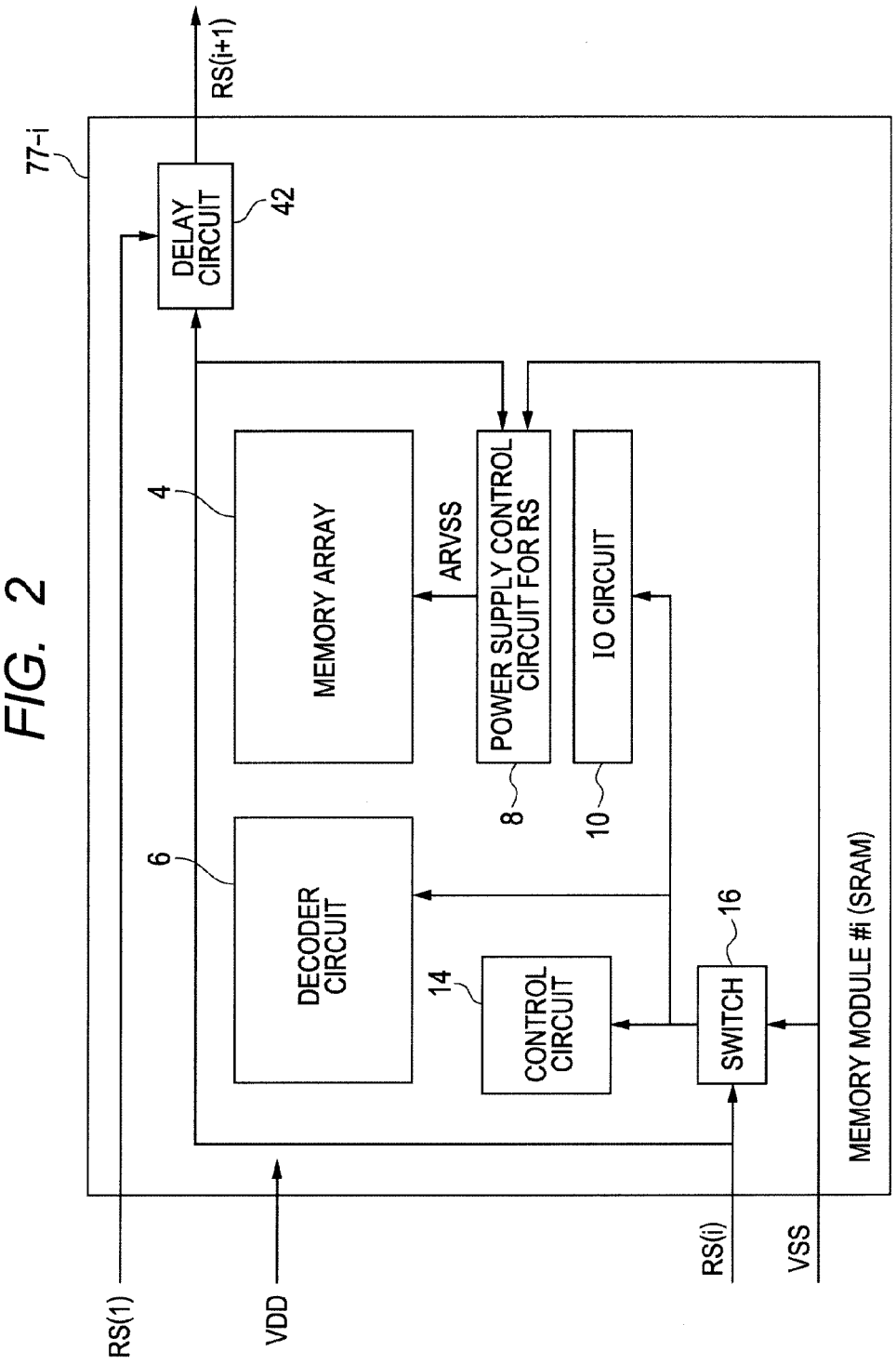
FIG. 2 shows the configuration of each memory module included in the resume-control-applied module of the first embodiment.

FIG. 2 shows the configuration of each memory module included in the resume-control-applied module of the first embodiment.

Referring to FIG. 2, memory module #i (77-i) (SRAM) includes a decoder circuit 6, a control circuit 14, a switch 16, a memory array 4, a power supply control circuit 8 for RS (hereinafter also referred to as an "RS power supply control circuit 8"), an IO circuit 10, and a delay circuit 42.

The decoder circuit 6 decodes addresses received from outside and selects memory cells in the memory array 4.

The control circuit 14 controls reading from and writing to SRAM cells in the memory array.

The switch 16 receives a resume control signal RS (i) from memory module #i−1 of the preceding stage and, when the resume control signal RS (i) rises to H level (indicating a transition from normal mode to resume mode), stops the supply of ground voltage VSS to the control circuit 14, decoder circuit 6 and IO circuit 10 so as to stop power consumption by these circuits.

The switch 16 receives a resume control signal RS (i) from memory module #i−1 of the preceding stage and, when the resume control signal RS (i) falls to L level (indicating a transition from resume mode to normal mode), resumes the supply of ground voltage VSS to the control circuit 14, decoder circuit 6 and IO circuit 10.

The memory array 4 includes SRAM cells. The SRAM cells are coupled to a VDD power supply node provided with a high voltage and an ARVSS power supply node provided with a low voltage.

The RS power supply control circuit 8 receives a ground voltage VSS from outside. In normal mode, the RS power supply control circuit 8 provides the ground voltage VSS to the ARVSS power supply node. In resume mode, the RS power supply control circuit 8 provides a voltage generated by raising the ground voltage VSS by a predetermined voltage to the ARVSS power supply node. This reduces, in resume mode, the voltage difference between the VDD power supply node and the ARVSS power supply node, so that power consumption can be reduced while retaining the data in the memory array 4.

The IO circuit 10 outputs, in a write operation, data received from outside to the memory array 4 and, in a read operation, outputs data from the memory array 4 to outside.

The delay circuit 42 outputs a resume control signal RS (i+1) generated by delaying the falling (the timing of transition from resume mode to normal mode) of the resume control signal RS (i) outputted from the preceding-stage memory module #i−1 or outputted from the logic section 73 to memory module #i+1 of the next stage.

(Delay Circuit)

Figure 3:
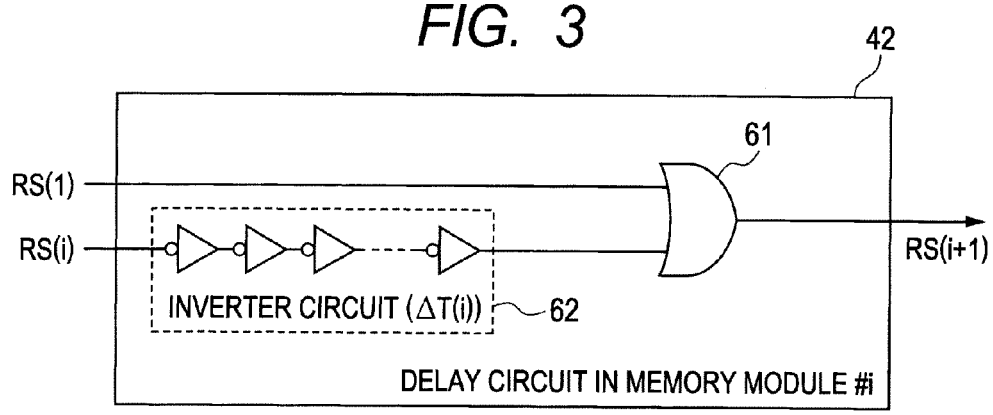
FIG. 3 shows the delay circuit included in memory module #i shown in FIG. 2.

FIG. 3 shows the delay circuit 42 included in memory module #i shown in FIG. 2.

Referring to FIG. 3, the delay circuit 42 includes an inverter circuit 62 and an OR circuit 61.

The inverter circuit 62 includes inverters of plural stages. A resume control signal RS (i) is inputted to the inverter circuit 62 and is outputted to the OR circuit 61 after being delayed by a predetermined time $\Delta T$ (i).

The OR circuit 61 outputs the logical sum of a resume control signal RS (1) and the output of the inverter circuit 62 as a resume control signal RS (i+1).

(Timing of Resume Control and Consumption Current)

Figure 4:
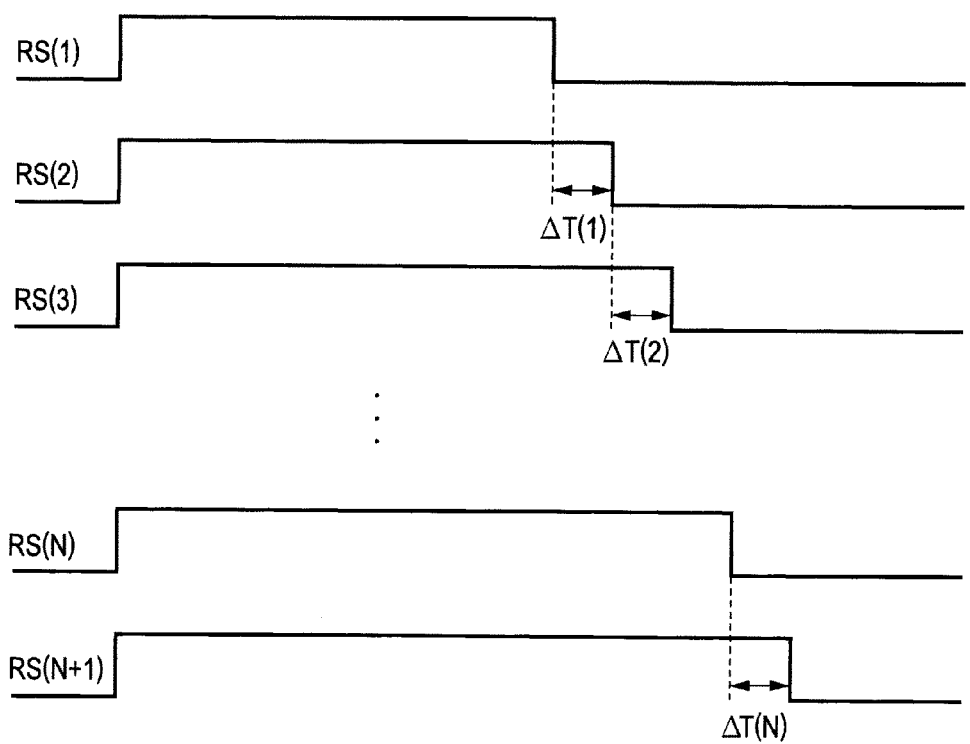
FIG. 4 shows timing of resume control signals.

FIG. 4 shows timing of resume control signals.

As shown in FIG. 4, the delay circuit 42 included in memory module #i (i=1 to N) outputs a resume control signal RS (i+1) equivalent to the resume control signal RS (i) the falling of which is delayed by a predetermined time $\Delta T$ (i).

Figure 5:
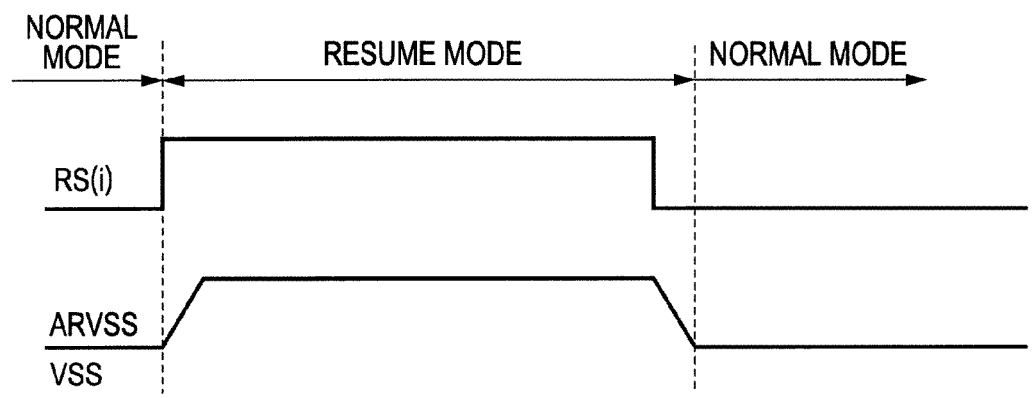
FIG. 5 shows changes in voltage of the resume control signal and at the ARVSS power supply node.

FIG. 5 shows changes in voltage of the resume control signal and at the ARVSS power supply node.

When the resume control signal RS (i) is activated to H level, the voltage provided from the RS power supply control circuit 8 to the ARVSS power supply node rises by a predetermined voltage. When the resume control signal RS (i) is deactivated to L level, the voltage provided from the RS power supply control circuit 8 to the ARVSS power supply node lowers back to the ground voltage VSS.

Figure 6:
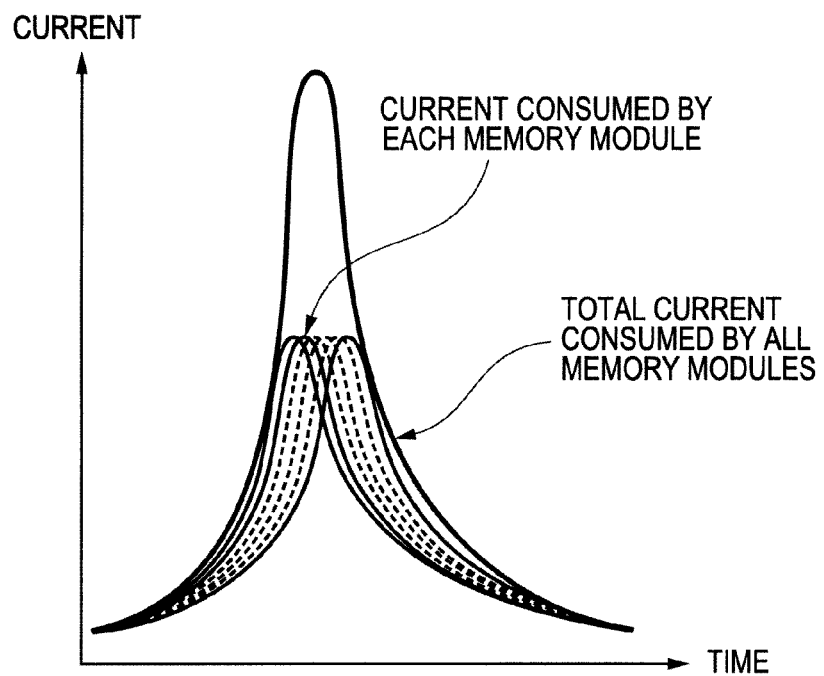
FIG. 6 shows variation with time of the consumption current during a transition from resume mode to normal mode according to related-art technology.

FIG. 6 shows variation with time of the consumption current during a transition from resume mode to normal mode according to related-art technology.

According to the related-art technology, all memory modules return from resume mode to normal mode at a time, so that, as shown in FIG. 6, the peak of total current consumed by all the memory modules becomes large.

Figure 7:
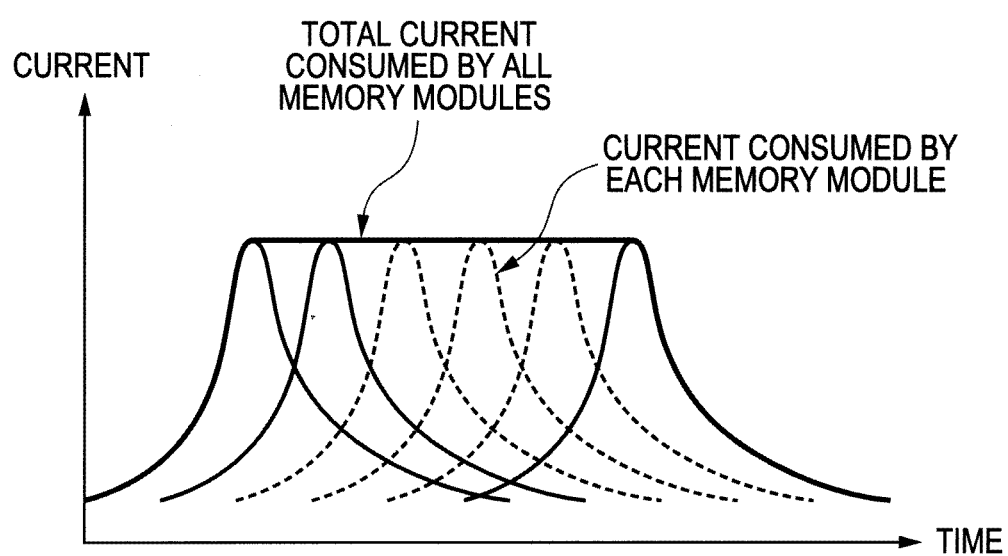
FIG. 7 shows variation with time of the consumption current during a transition from resume mode to normal mode according to the first embodiment of the present invention.

FIG. 7 shows variation with time of the consumption current during a transition from resume mode to normal mode according to the first embodiment of the present invention.

According to the present embodiment, the timing of the resume control signal RS (i) being activated to L level (the timing of transition from resume mode to normal mode) differs between memory modules #i as shown in FIG. 4. That is, the timing of returning from resume mode to normal mode of any memory module #i differs from the corresponding timing of any other module Namely, different memory modules #i return from resume mode to normal mode at different times consuming currents for mode transition at different times. This lowers and flattens the peak of total current consumed by all the memories as shown in FIG. 7.

Modification Example 1 of the First Embodiment

Figure 8:
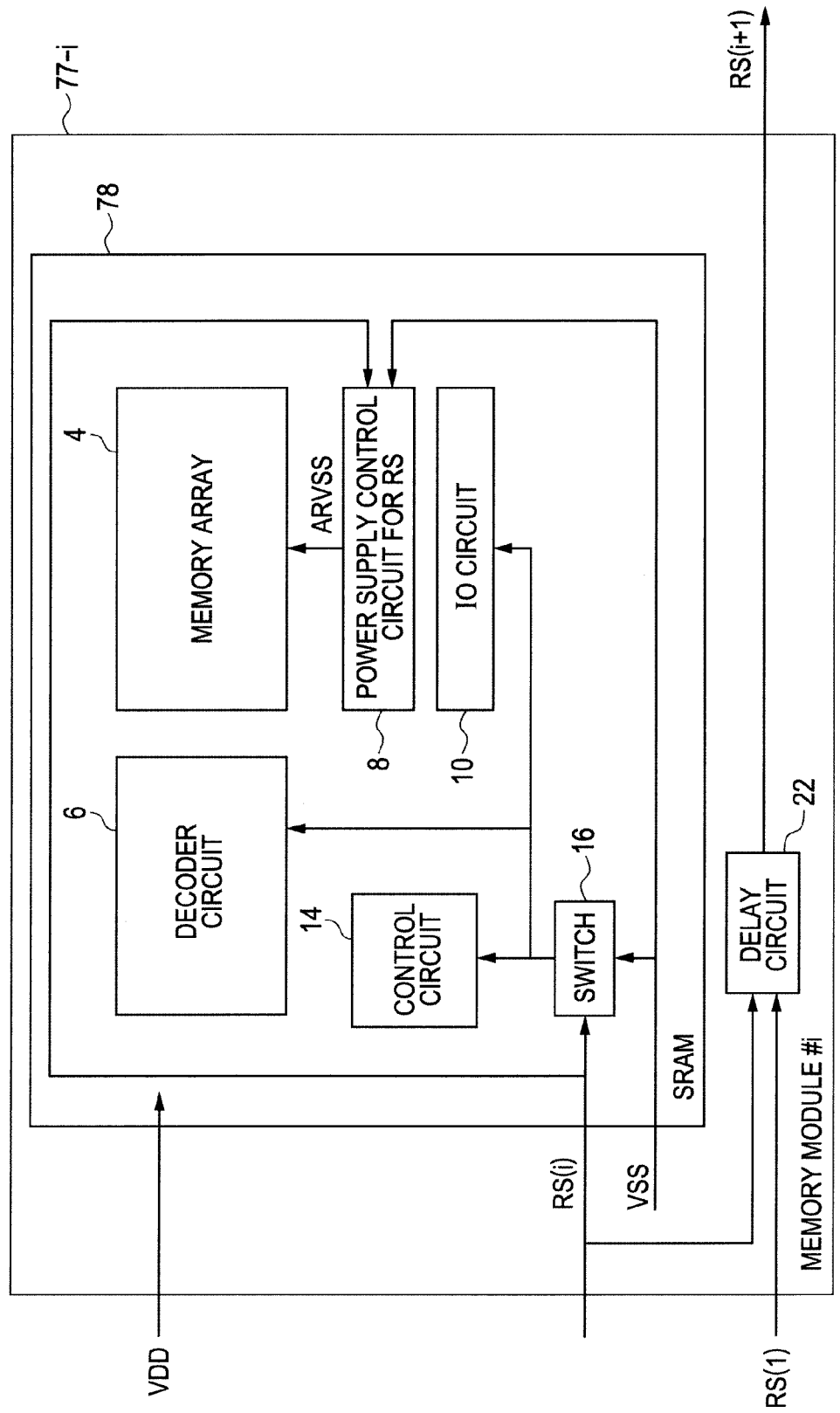
FIG. 8 shows a memory module configuration according to modification example 1 of the first embodiment.

FIG. 8 shows a memory module configuration according to modification example 1 of the first embodiment.

Even though, according to the first embodiment, the delay circuit 42 is provided inside an SRAM, in modification example 1 shown in FIG. 8, a delay circuit 22 is provided outside an SRAM.

Modification Example 2 of the First Embodiment

Figure 9:
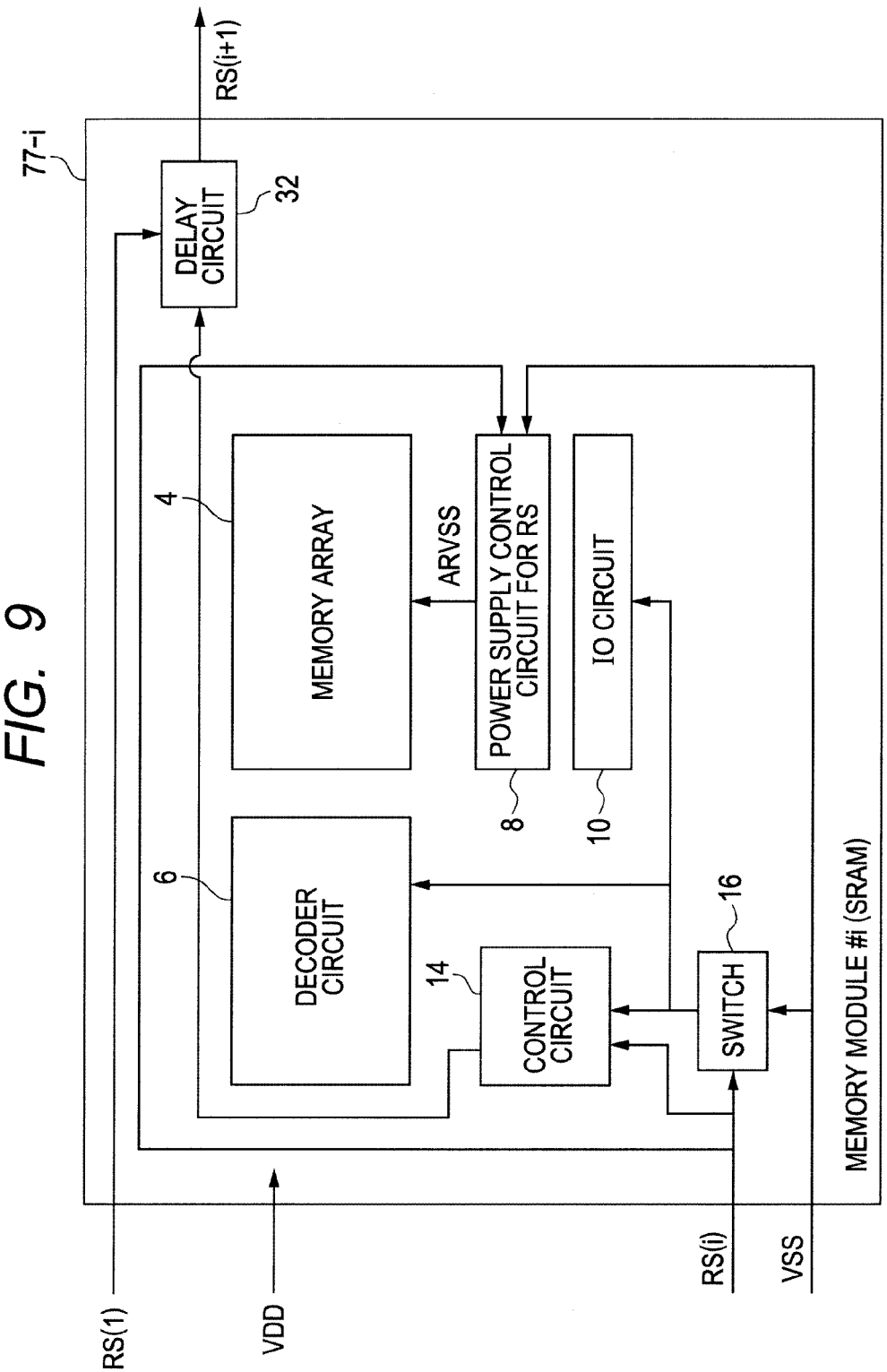
FIG. 9 shows a memory module configuration according to modification example 2 of the first embodiment.

FIG. 9 shows a memory module configuration according to modification example 2 of the first embodiment.

As shown in FIG. 9, a resume control signal RS (i) outputted from memory module #i−1 of the preceding stage is sent to a control circuit 14 causing the control circuit 14 to output an intermediate signal NRS (i) to a delay circuit 32. The delay circuit 32 then outputs a resume control signal RS (i+1) to memory module #i+1 of the next stage.

Figure 10:
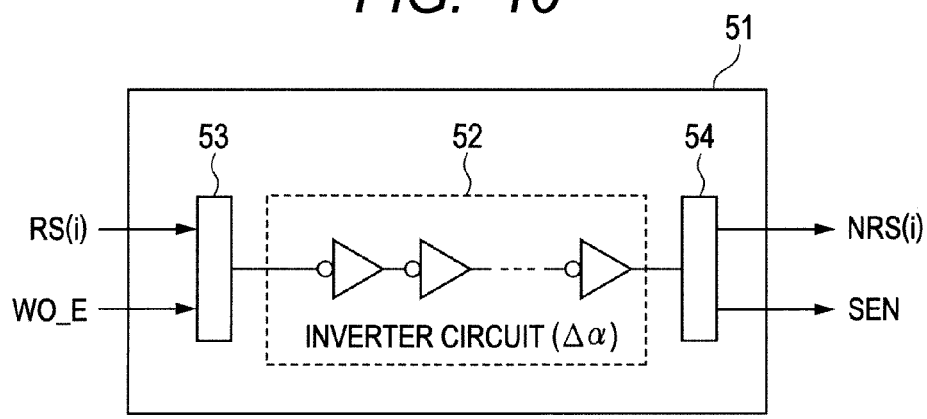
FIG. 10 shows the delay circuit included in the control circuit of memory module #i according to modification example 2.

FIG. 10 shows a delay circuit 51 included in the control circuit 14 of memory module #i according to modification example 2.

The delay circuit 51 includes an input selector 53, an inverter circuit 52, and an output selector 54.

A first control signal for controlling a constituent element of memory module #i (for example, signal WO_E for controlling word line activation in the memory array) and a resume control signal RS (i) are inputted to the input selector 53.

The input selector 53 outputs, in normal mode, the first control signal (WO_E) or, in resume mode, the resume control signal RS (i) to the inverter circuit 52.

The inverter circuit 52 includes inverters of plural stages. In normal mode, the inverter circuit 52 delays the first control signal (WO_E) inputted thereto from the input selector 53 by a predetermined time ($\Delta\alpha$) and outputs the delayed signal as a second control signal for controlling another constituent element of the memory module #i (for example, signal SEN for controlling sense amplifier activation in the memory array) to the output selector 54. In resume mode, the inverter circuit 52 delays the resume control signal RS (i) inputted thereto from the input selector 53 by a predetermined time ($\Delta\alpha$) and outputs the delayed signal as an intermediate signal NRS (i) to the output selector 54.

The output selector 54 outputs, in normal mode, the second control signal (SEN) or, in resume mode, the intermediate signal NRS (i) to the delay circuit 32.

Figure 11:
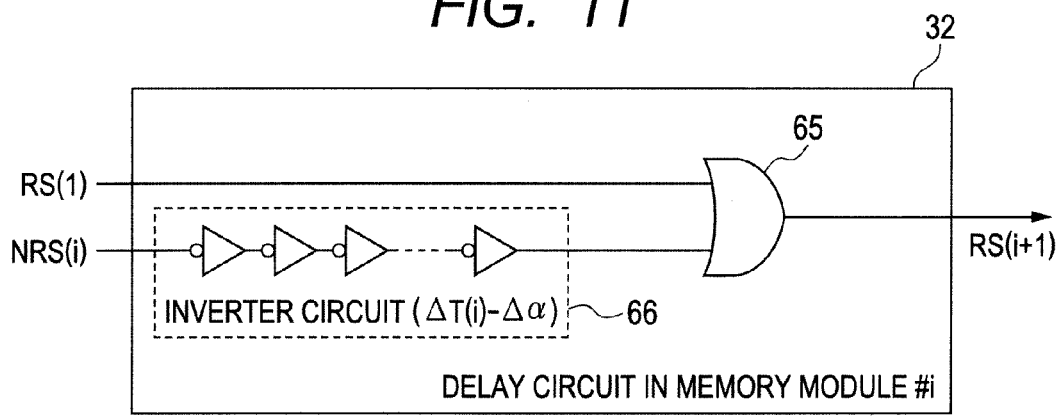
FIG. 11 shows the delay circuit included in memory module #i shown in FIG. 9.

FIG. 11 shows the delay circuit 32 included in memory module #i shown in FIG. 9. Referring to FIG. 11, the delay circuit 32 includes an inverter circuit 66 and an OR circuit 65.

The inverter circuit 66 includes inverters of plural stages. An intermediate signal NRS (i) is inputted to the inverter circuit 66 and is outputted to the OR circuit 65 after being delayed by a predetermined time ($\Delta T$ (i)−$\Delta\alpha$).

The OR circuit 65 outputs the logical sum of a resume control signal RS (1) and the output of the inverter circuit 66 as a resume control signal RS (i+1).

The resume control signal RS (i) causes, by passing the delay circuit 51 included in the control circuit 14 and the delay circuit 32, the falling of the resume control signal RS (i+1) to be delayed by $\Delta T$ (i) from the falling of the resume control signal RS (i).

As described above, according to modification example 2, the delay circuit included in the control circuit can be made use of as part of a delay circuit used to generate, based on a resume control signal RS (i), a resume control signal RS (i+1) for the next stage. This makes it possible to decrease the number of stages of inverters included in the delay circuit 32 so as to minimize the increase in circuit area.

Second Embodiment

Figure 12:
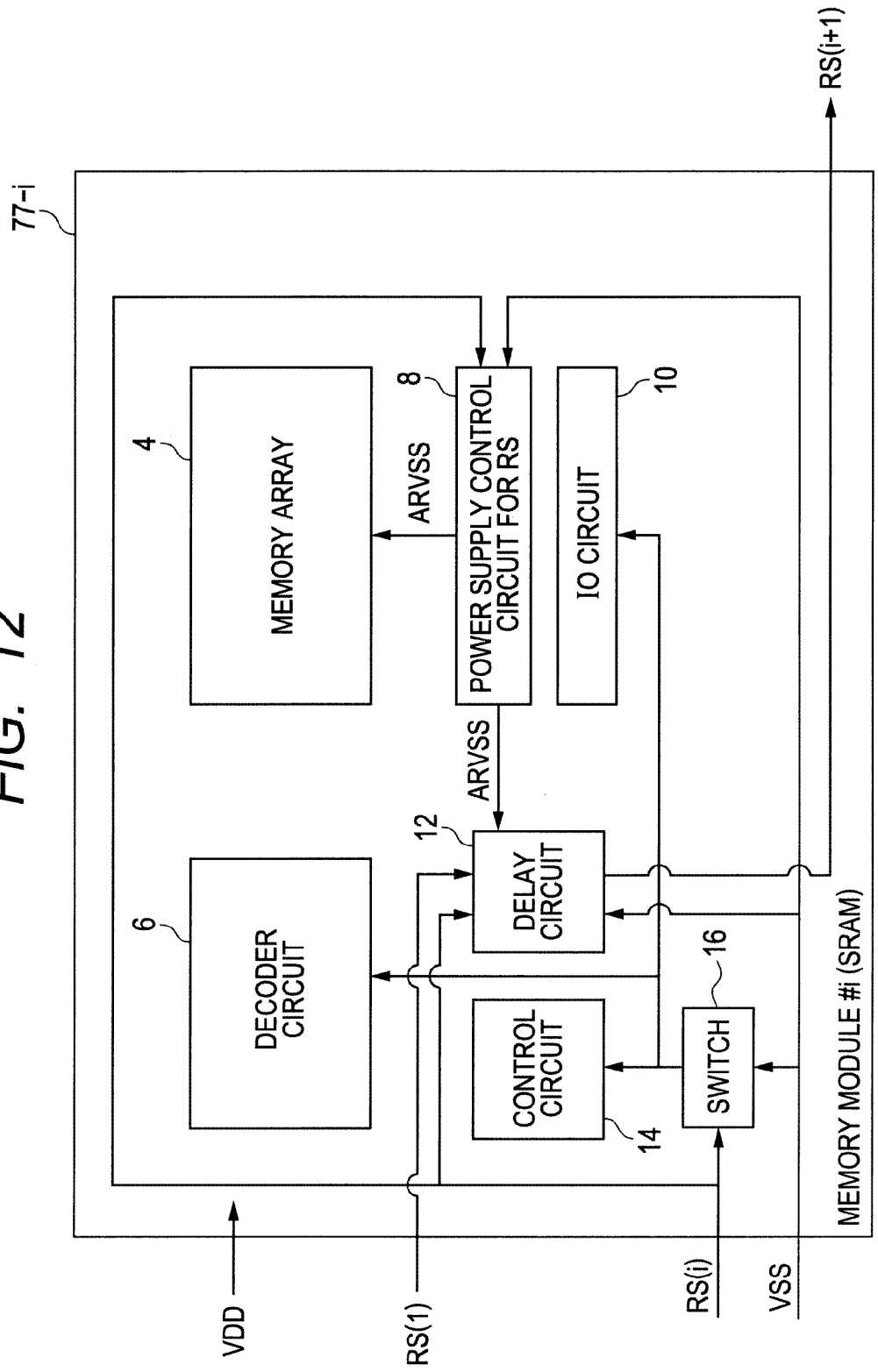
FIG. 12 shows a memory module configuration according to a second embodiment of the present invention.

FIG. 12 shows a memory module configuration according to a second embodiment of the present invention.

The memory module shown in FIG. 12 differs from the memory module shown in FIG. 2 regarding a delay circuit 12.

The delay circuit 12 compares the voltage outputted from the RS power supply control circuit 8 and the ground voltage VSS and, when their magnitudes coincide, causes the resume control signal RS (i+1) for the next-stage memory module to fall.

Figure 13:
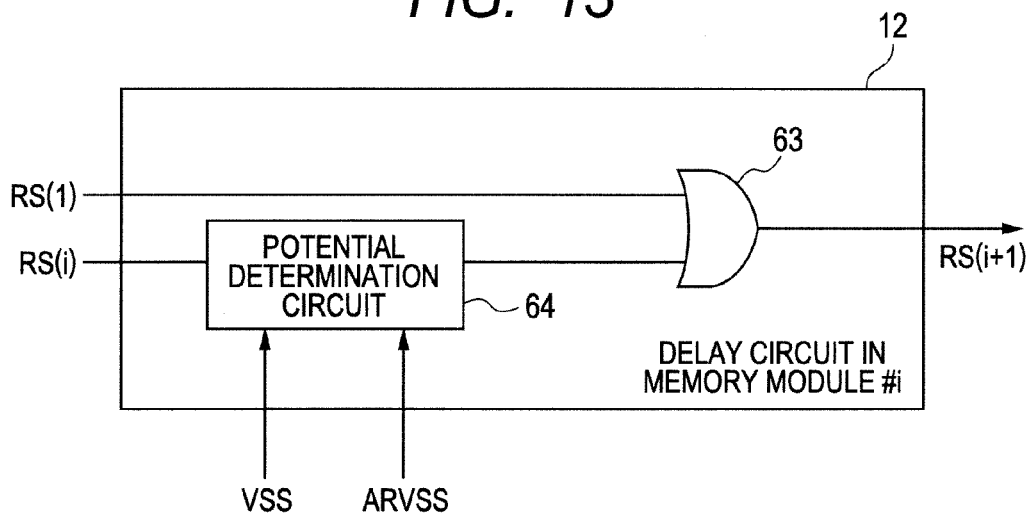
FIG. 13 shows the delay circuit included in memory module #i shown in FIG. 12.

FIG. 13 shows the delay circuit included in memory module shown in FIG. 12. The delay circuit includes a potential determination circuit 64 and an OR circuit 63.

When the memory module returns from resume mode to normal mode, the RS power supply control circuit 8 lowers the voltage raised for supply to the ARVSS power supply node down to the ground voltage VSS.

When the resume control signal RS (i) is activated to H level, the potential determination circuit 64 outputs an H-level signal to the OR circuit 63 and, when the magnitudes of the voltage outputted from the RS power supply control circuit 8 and the ground voltage VSS coincide, causes the H-level signal to fall.

The potential determination circuit 64 is required to monitor the voltage outputted from the RS power supply control circuit 8. With LSIs operated by increasingly low voltages recently, the potential determination circuit 64 is required to be capable of detecting fine potential differences. Hence, it is desirable to locate the potential determination circuit 64 close to the RS power supply control circuit 8 so as to make the circuit less affected by noise.

The OR circuit 63 outputs the logical sum of a resume control signal RS (1) and the output of the potential determination circuit 64 as a resume control signal RS (i+1).

Figure 14:
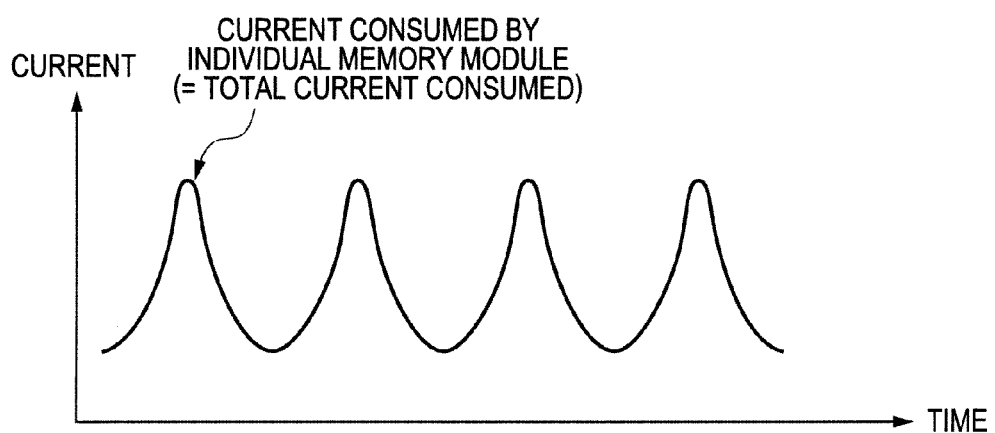
FIG. 14 shows variation with time of the consumption current during a transition from resume mode to normal mode according to the second embodiment of the present invention.

FIG. 14 shows variation with time of the consumption current during a transition from resume mode to normal mode according to the second embodiment of the present invention.

As shown in FIG. 14, according to the second embodiment, memory module #i+1 starts returning from resume mode to normal mode after memory module #i returns from resume mode to normal mode, so that the peak of total current consumed by all the memory modules can be made, without fail, lower than that in the first embodiment.

Third Embodiment

Figure 15:
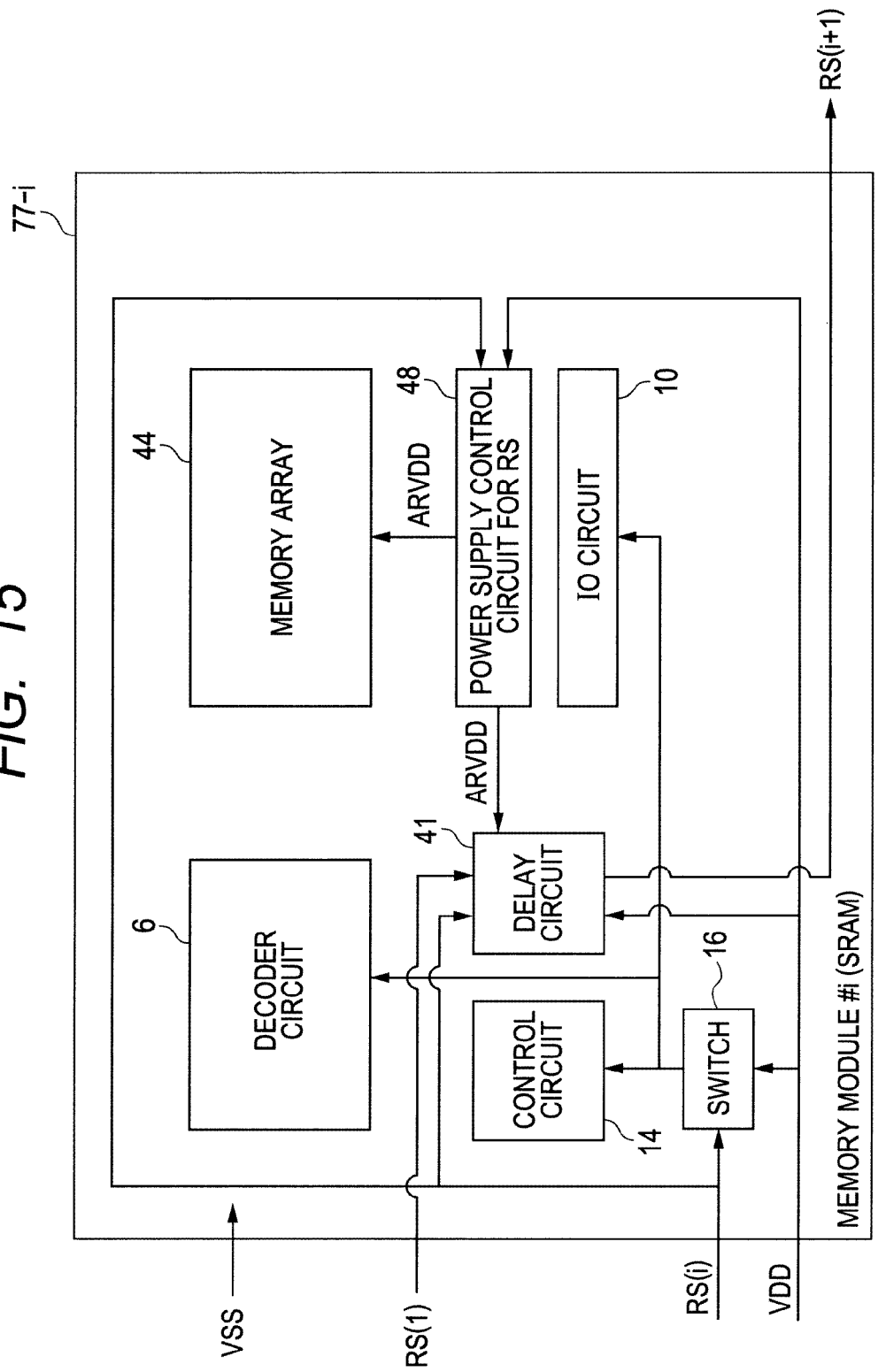
FIG. 15 shows a memory module configuration according to a third embodiment of the present invention.

FIG. 15 shows a memory module configuration according to a third embodiment of the present invention.

The memory module shown in FIG. 15 differs from the memory module shown in FIG. 2 regarding memory array 44, delay circuit 41, and RS power supply control circuit 48.

The memory array 44 includes SRAM cells coupled to an ARVDD power supply node provided with a high voltage and a VSS power supply node provided with a low voltage.

The RS power supply control circuit 48 receives a positive source voltage VDD from outside. In normal mode, the RS power supply control circuit 48 provides a positive source voltage VDD to the ARVDD power supply node. In resume mode, the RS power supply control circuit 48 provides a voltage generated by lowering the positive source voltage VDD by a predetermined voltage to the ARVDD power supply node. This reduces, in resume mode, the voltage difference between the ARVDD power supply node and the VSS power supply node, so that power consumption can be reduced while retaining the data held in the memory array 44.

Figure 16:
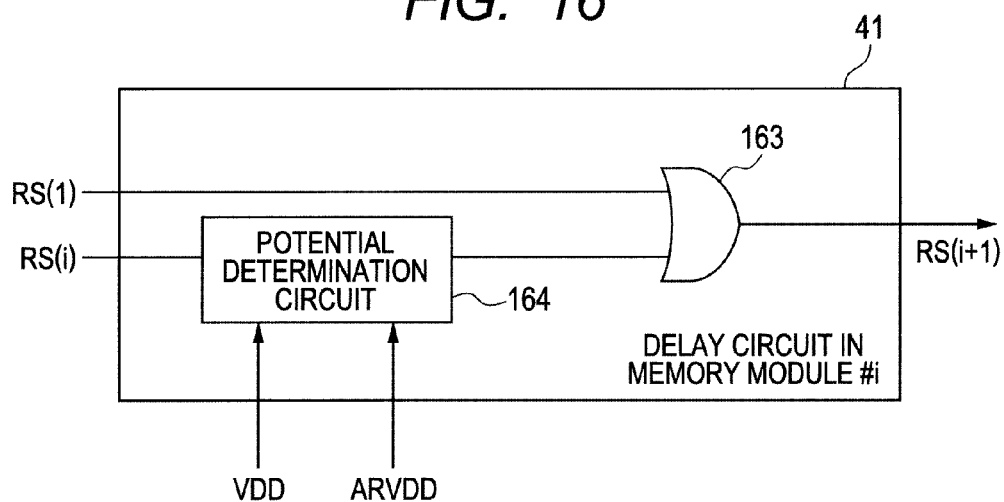
FIG. 16 shows the delay circuit included in memory module #i shown in FIG. 15.

FIG. 16 shows the delay circuit included in memory module #i shown in FIG. 15. The delay circuit 41 includes a potential determination circuit 164 and an OR circuit 163.

When the memory module returns from resume mode to normal mode, the RS power supply control circuit 48 raises the voltage lowered for supply to the ARVDD power supply node up to the source voltage VDD.

When the resume control signal RS (i) is activated to H level, the potential determination circuit 164 outputs an H-level signal to the OR circuit 163 and, when the magnitudes of the voltage outputted from the RS power supply control circuit 48 and the source voltage VDD coincide, causes the H-level signal to rise.

The OR circuit 163 outputs the logical sum of a resume control signal RS (1) and the output of the potential determination circuit 164 as a resume control signal RS (i+1).

Figure 17:
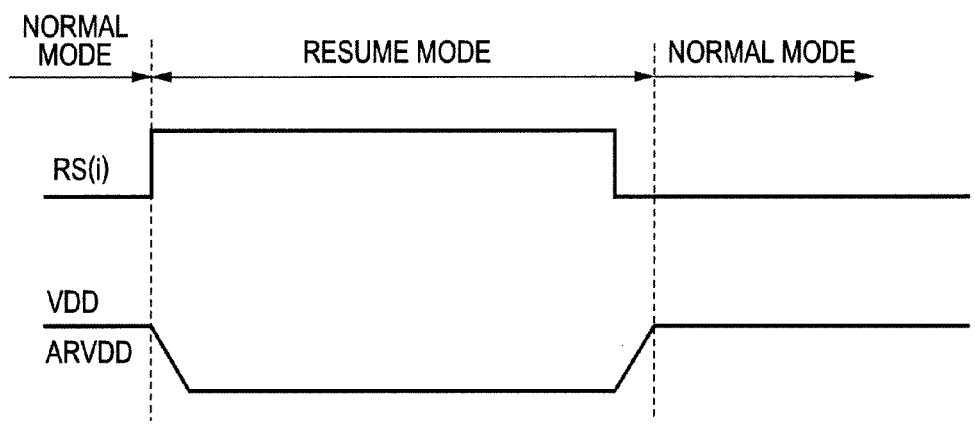
FIG. 17 shows changes in voltage of the resume control signal and at the ARVDD power supply node.
Figure 18:
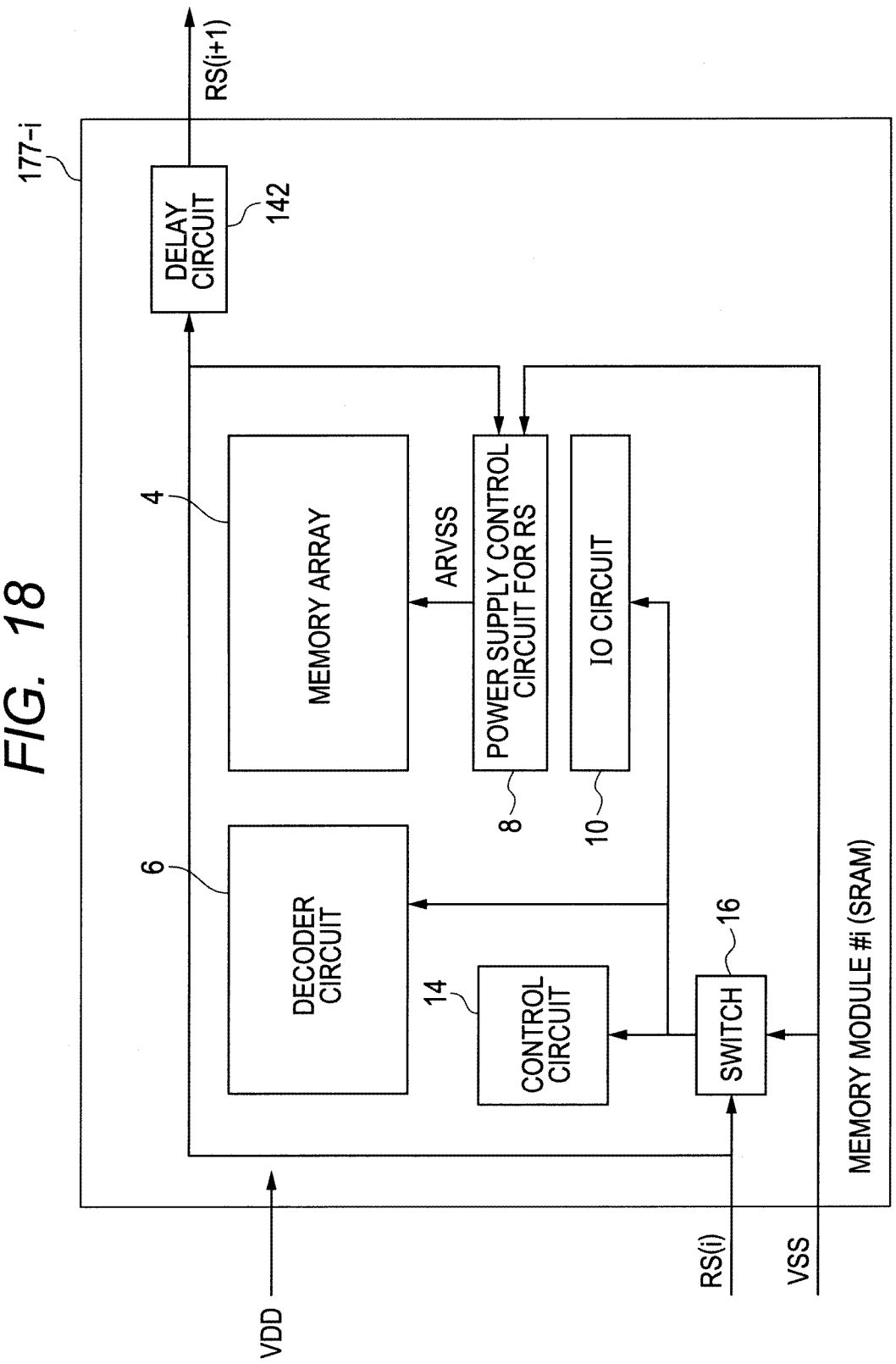
FIG. 18 shows the configuration of each memory module included in the resume-control-applied module according to a modification example.

FIG. 17 shows changes in voltage of the resume control signal and at the ARVDD power supply node.

When the resume control signal RS (i) is activated to H level, the voltage provided from the RS power supply control circuit 48 to the ARVDD power supply node lowers by a predetermined voltage. When the resume control signal RS (i) is deactivated to L level, the voltage provided from the RS power supply control circuit 48 to the ARVDD power supply node rises back to the source voltage VDD.

Like in the second embodiment, according to the third embodiment, too, memory module #i+1 starts returning from resume mode to normal mode after memory module #i returns from resume mode to normal mode, so that the peak of total current consumed by all the memory modules can be made, without fail, lower than that in the first embodiment.

Modification Examples

The present invention is not limited to the above embodiments, and various modifications are possible within the scope of the invention, for example, as follows.

(1) Input to Delay Circuit

Even though, in the above embodiments of the invention, a resume control signal RS (1) is inputted to the delay circuit as shown in FIGS. 2, 3, 8, 9, 12, 13, 15 and 16, the input signal to the delay circuit is not limited to the resume control signal RS (1).

For example, since a resume control signal RS (i+1) can be generated using a resume control signal RS (i) only, the delay circuits shown in FIGS. 2, 3, 8, 9, 12, 13, 15 and 16 may be replaced by the delay circuits shown in FIGS. 18 to 25.

Figure 19:
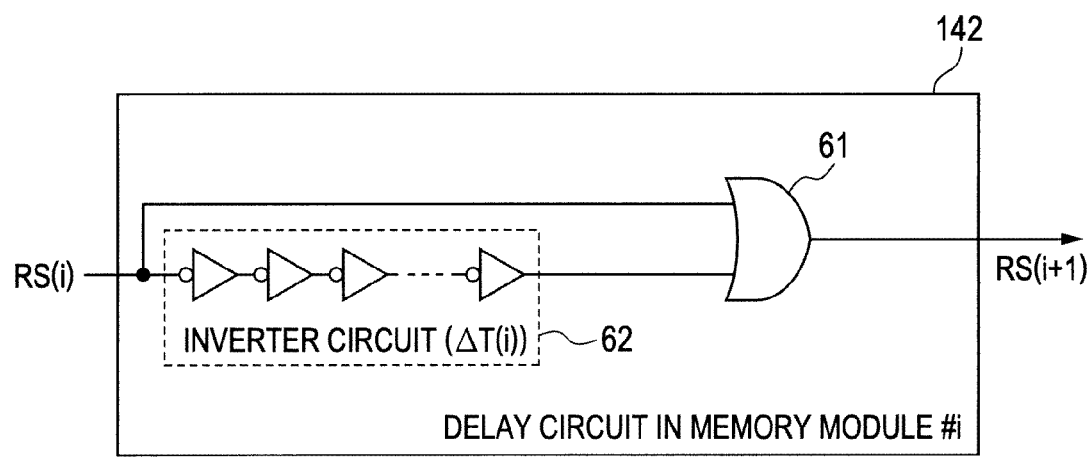
FIG. 19 shows the delay circuit included in memory module #i according to a modification example.
Figure 20:
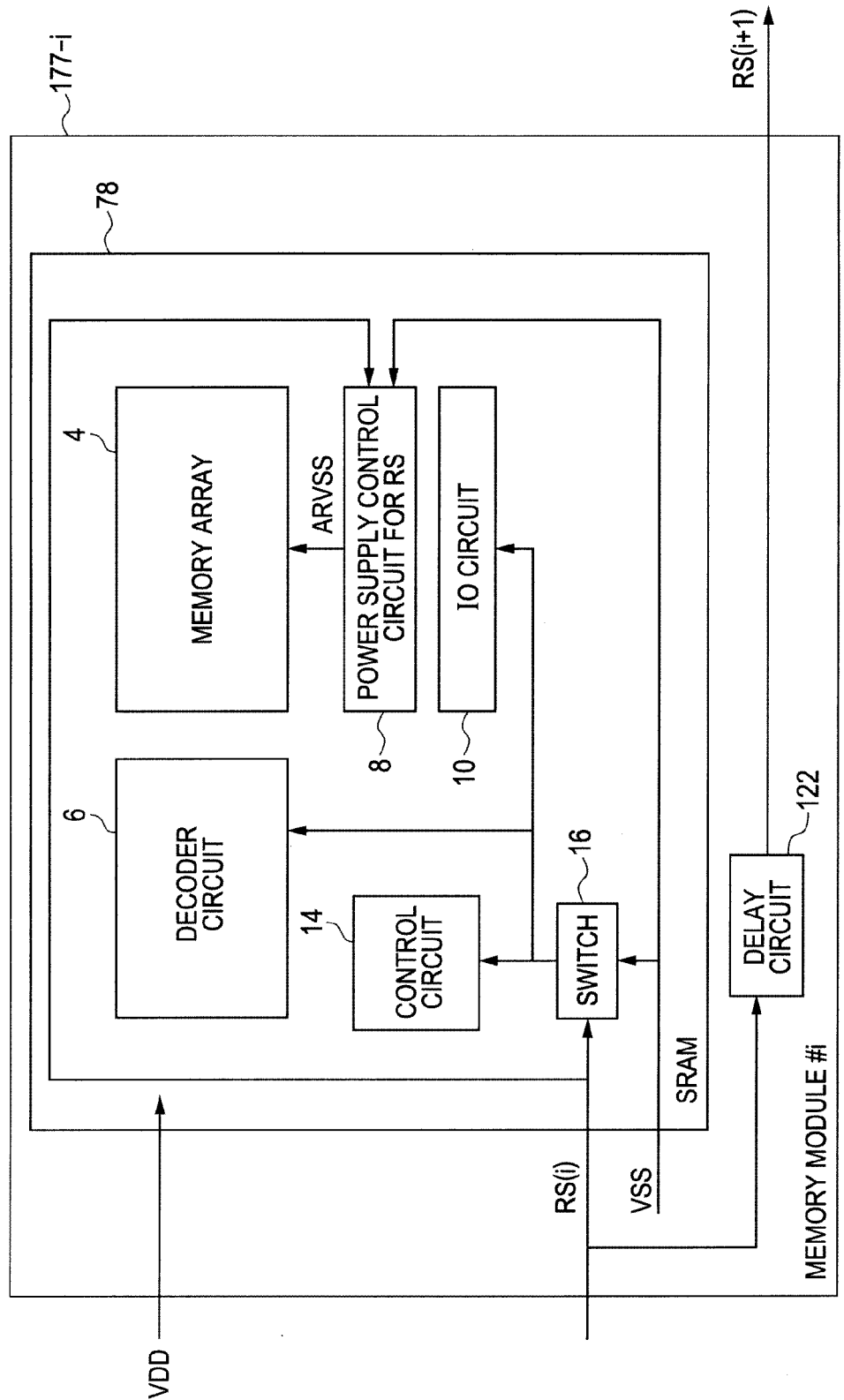
FIG. 20 shows a memory module configuration according to a modification example.
Figure 21:
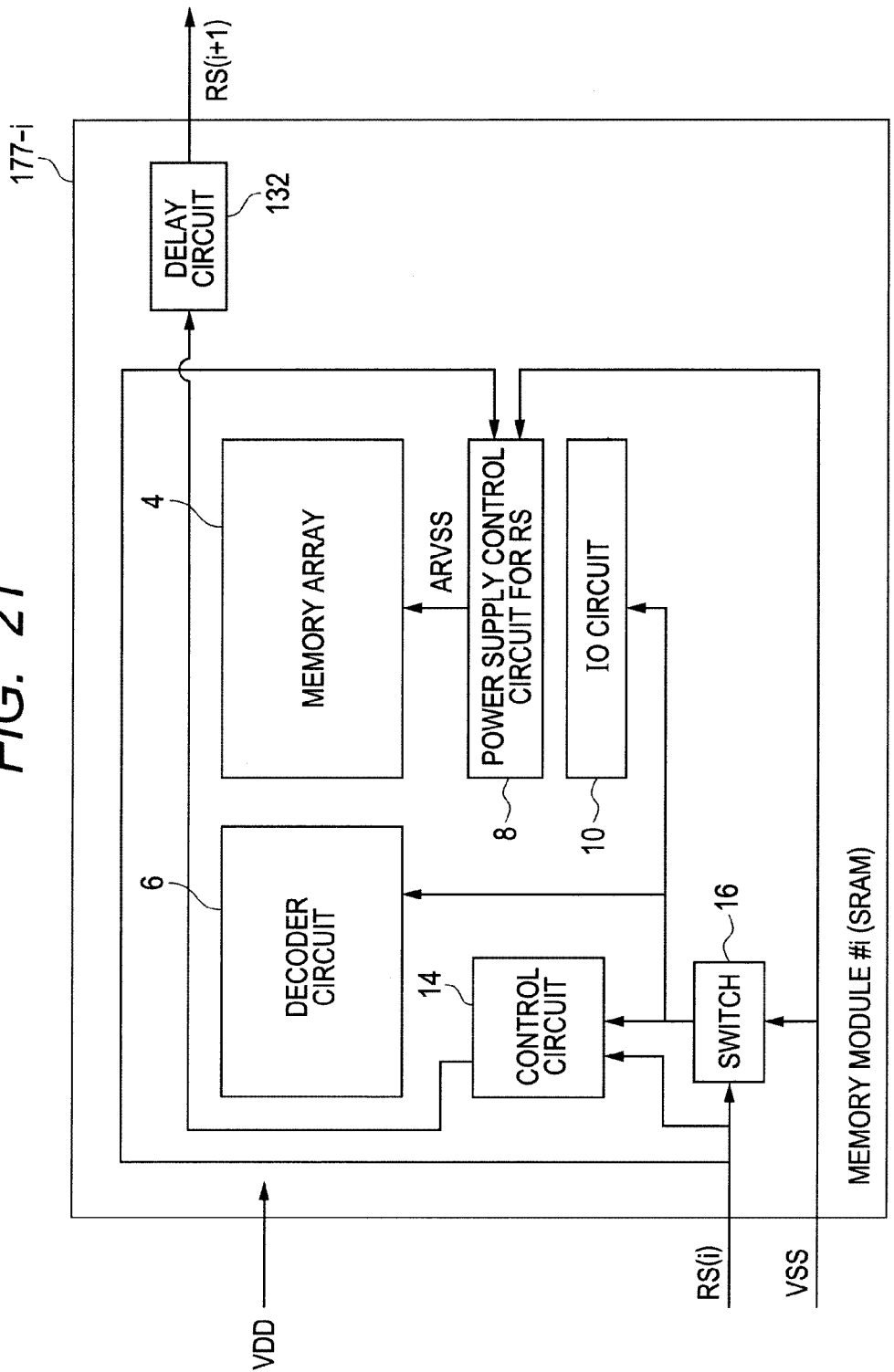
FIG. 21 shows a memory module configuration according to a modification example.
Figure 22:
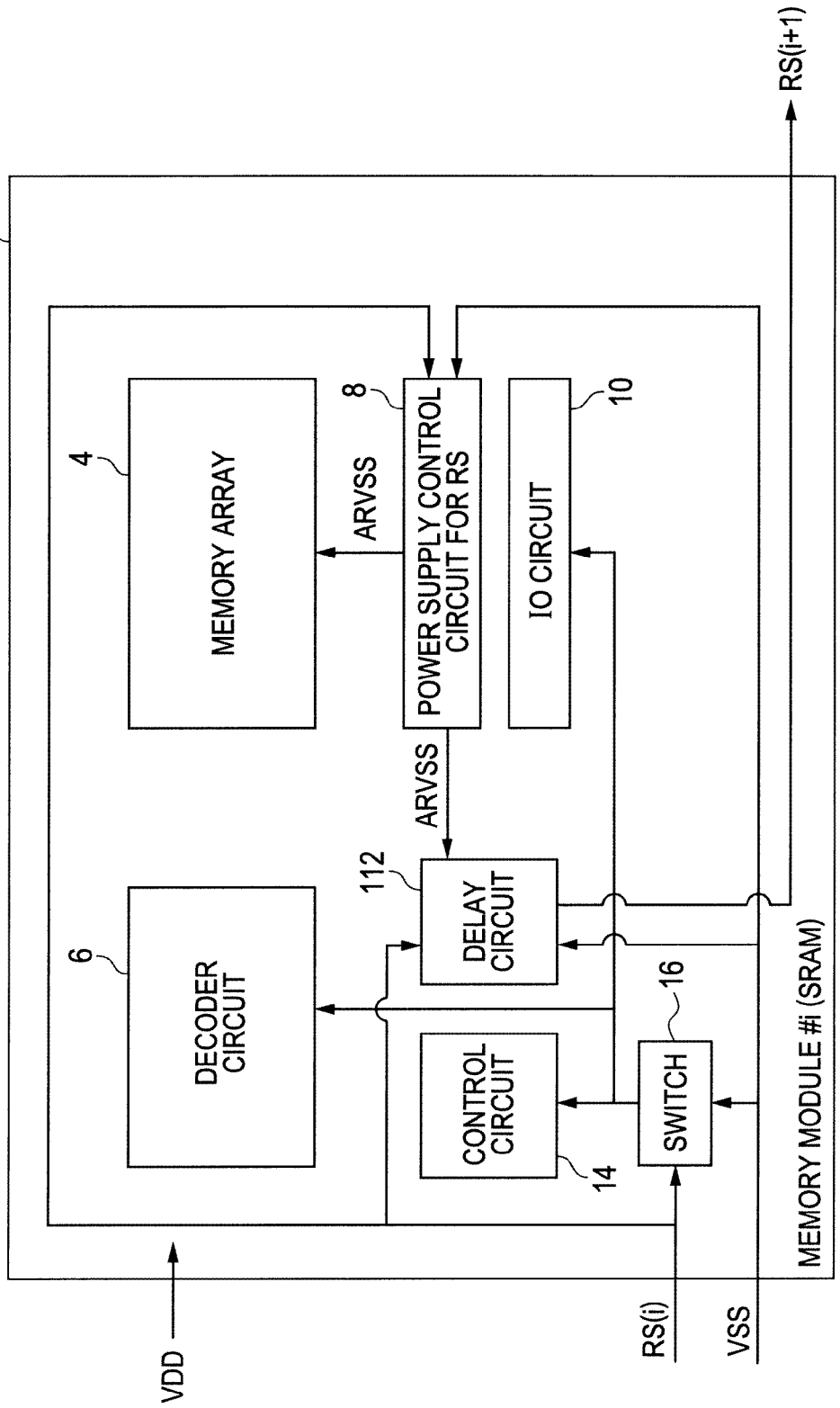
FIG. 22 shows a memory module configuration according to a modification example.
Figure 23:
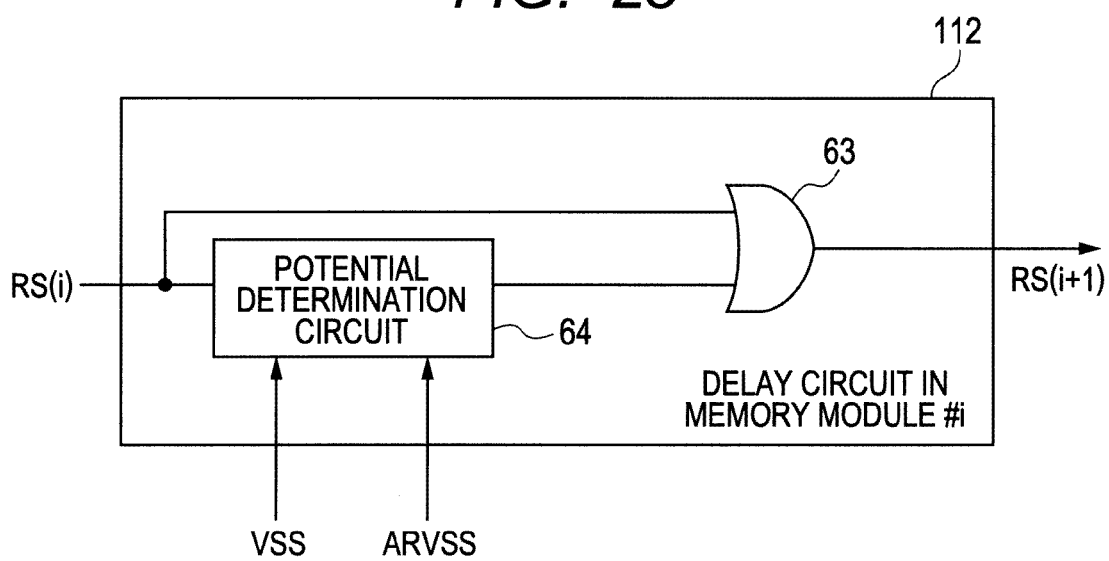
FIG. 23 shows the delay circuit included in memory module #i according to a modification example.
Figure 24:
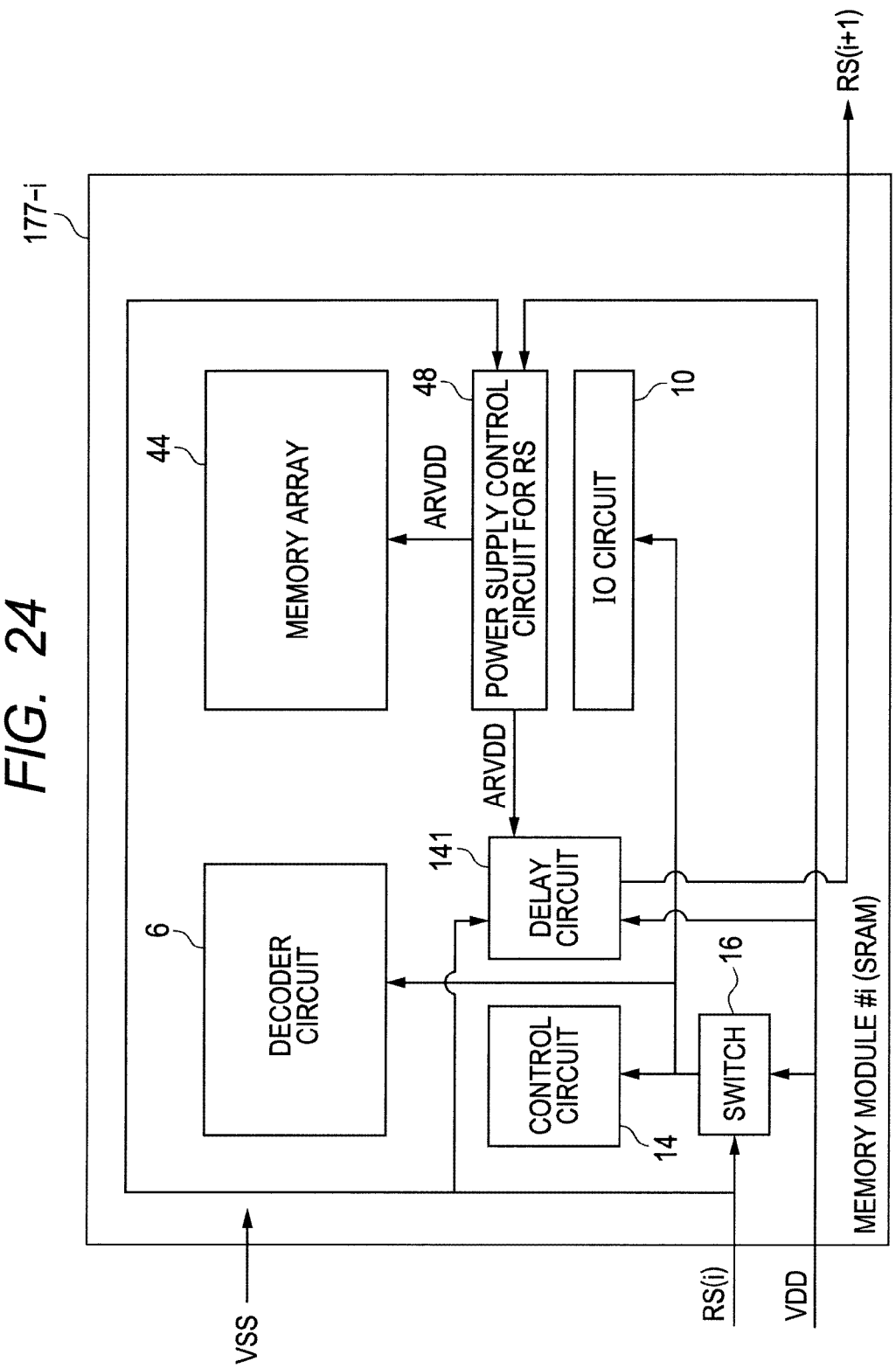
FIG. 24 shows a memory module configuration according to a modification example.
Figure 25:
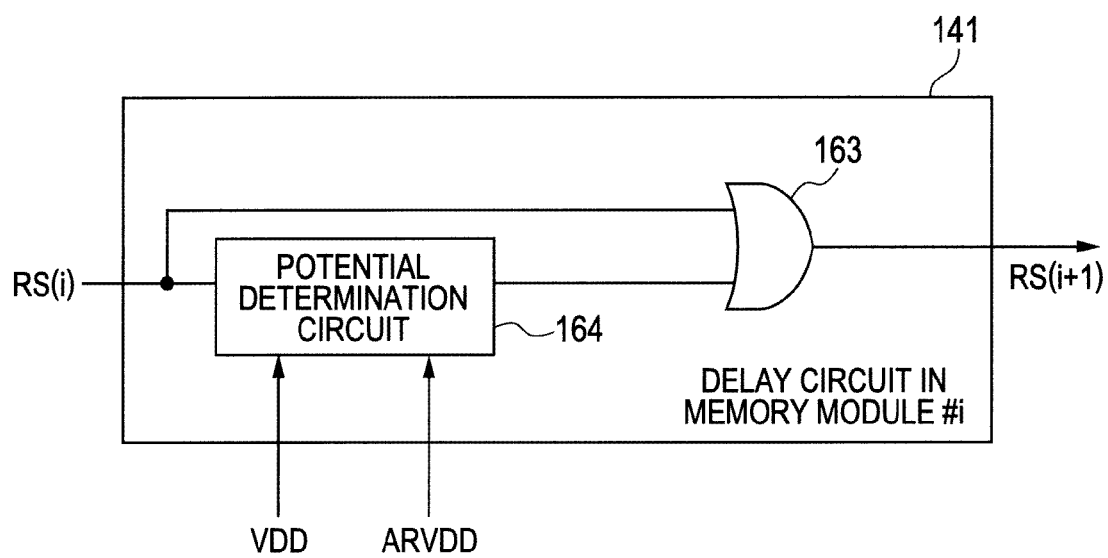
FIG. 25 shows the delay circuit included in memory module #i according to a modification example.

The delay circuit 142 shown in FIG. 19, for example, includes an inverter circuit 62 and an OR circuit 61.

The inverter circuit 62 includes inverters of plural stages. A resume control signal RS (i) is inputted to the inverter circuit 62 and is outputted to the OR circuit 61 after being delayed by a predetermined amount of time $\Delta T$ (i). The OR circuit 61 outputs the logical sum of the resume control signal RS (i) and the output of the inverter circuit 62 as a resume control signal RS (i+1).

The foregoing embodiments are to be considered in all respects as illustrative and not restrictive. The scope of the invention is defined not by the above description but by the appended claims, and all changes coming within the meaning and range of equivalence of the claims are to be understood as being embraced therein.

What is claimed is:

1. A semiconductor device comprising:
a plurality of first memory modules; and
a logic circuit capable of providing to the plurality of first memory modules a resume control signal having a first level and a second level different from the first level, the first level being defined for a normal mode of the plurality of first memory modules, and the second level being defined for a resume mode of the plurality of first memory modules;
wherein each of the plurality of first memory module comprises:
a memory array;
an I/O circuit;
a decoder circuit;
a switch which cuts off, in the resume mode, a source voltage supply to the I/O circuit and the decoder circuit and for providing, in the normal mode, the source voltage supply to the I/O circuit and the decoder circuit; and
a delay circuit which receives the resume control signal ordering a transition from the resume mode to the normal mode and outputs a delayed resume control signal delayed from the inputted resume control signal to a next-stage memory module,
wherein the each memory module comprises a control circuit including inverters of plural stages to which, in the normal mode, a first control signal for controlling a constituent element of the each memory module is inputted and which generate, by delaying the inputted first control signal, a second control signal for controlling another constituent element of the each memory module and to which, in the resume mode, the resume control signal is inputted and which generate, by delaying the inputted resume control signal, an intermediate signal, and
wherein the delay circuit includes inverters of plural stages to which the intermediate signal is inputted from the plural-stage inverters included in the control circuit and which generate, by delaying the inputted intermediate signal, a resume control signal to be outputted to the next-stage memory module.

2. The semiconductor device according to claim 1, wherein the delay circuit includes inverters of plural stages to which a resume control signal is inputted and which generate, by delaying the inputted resume control signal, a resume control signal to be outputted to the next-stage memory module.

3. A semiconductor device having a plurality of memory modules, each memory module comprising:
a memory array;
a switch for controlling, in a resume mode, source voltage supply to a constituent element of the each memory module; and
a delay circuit which receives a resume control signal ordering a transition from the resume mode to a normal mode and outputs a delayed resume control signal delayed from the inputted resume control signal to a next-stage memory module; and
a power supply control circuit,
wherein the memory array included in the each memory module includes an SRAM cell coupled to a first power supply node and a second power supply node,
wherein the power supply control circuit supplies, in the normal mode, a first voltage to the second power supply node and, in the resume mode, a voltage generated by raising the first voltage to the second power supply node,
wherein the power supply control circuit supplies a second voltage higher than the first voltage to the first power supply node in the normal and the resume mode,
wherein, when a transition from the resume mode to the normal mode is made, the power supply control circuit lowers the raised voltage provided to the second power supply node down to the first voltage, and
wherein the delay circuit compares the magnitudes of the voltage outputted from the power supply control circuit and the first voltage and, when the magnitudes of the two voltages coincide, outputs the resume control signal to the next-stage memory module.

4. A semiconductor device having a plurality of memory modules, each memory module comprising:
a memory array;
a switch for controlling, in a resume mode, source voltage supply to a constituent element of the each memory module;
a delay circuit which receives a resume control signal ordering a transition from the resume mode to a normal mode and outputs a resume control signal delayed from the inputted resume control signal to a next-stage memory module; and
a power supply control circuit,
wherein the memory array included in the each memory module includes an SRAM cell coupled to a first power supply node and a second power supply node,
wherein the power supply control circuit supplies a first voltage to the second power supply node in normal and resume modes,
wherein the power supply control circuit supplies, in normal mode, a second voltage higher than the first voltage to the first power supply node and, in resume mode, a voltage generated by lowering the second voltage to the first power supply node,
wherein, when a transition from the resume mode to the normal mode is made, the power supply control circuit raises the lowered voltage provided to the first power supply node up to the second voltage, and
wherein the delay circuit compares the magnitudes of the voltage outputted from the power supply control circuit and the second voltage and, when the magnitudes of the two voltages coincide, outputs the resume control signal to the next-stage memory module.

5. The semiconductor device according to claim 4,
wherein the each memory module comprises a control circuit including inverters of plural stages to which, in the normal mode, a first control signal for controlling a constituent element of the each memory module is inputted and which generate, by delaying the inputted first control signal, a second control signal for controlling another constituent element of the each memory module and to which, in the resume mode, the resume control signal is inputted and which generate, by delaying the inputted resume control signal, an intermediate signal, and
wherein the delay circuit includes inverters of plural stages to which the intermediate signal is inputted from the plural-stage inverters included in the control circuit and which generate, by delaying the inputted intermediate signal, a resume control signal to be outputted to the next-stage memory module.

6. The semiconductor device according to claim 3,
wherein the each memory module comprises a control circuit including inverters of plural stages to which, in the normal mode, a first control signal for controlling a constituent element of the each memory module is inputted and which generate, by delaying the inputted first control signal, a second control signal for controlling another constituent element of the each memory module and to which, in the resume mode, the resume control signal is inputted and which generate, by delaying the inputted resume control signal, an intermediate signal, and
wherein the delay circuit includes inverters of plural stages to which the intermediate signal is inputted from the plural-stage inverters included in the control circuit and which generate, by delaying the inputted intermediate signal, a resume control signal to be outputted to the next-stage memory module.

7. A semiconductor device comprising:
a plurality of first memory modules; and
a logic circuit capable of providing to the plurality of first memory modules a resume control signal having a first level and a second level different from the first level, the first level being defined for a normal mode of the plurality of first memory modules, and the second level being defined for a resume mode of the plurality of first memory modules; and
a plurality of second memory modules which is always in the normal mode,
wherein each of the plurality of first memory modules comprises:
a memory array;
an I/O circuit;
a decoder circuit;
a switch which cuts off, in the resume mode, a source voltage supply to the I/O circuit and the decoder circuit and for providing, in the normal mode, the source voltage supply to the I/O circuit and the decoder circuit; and
a delay circuit which receives the resume control signal ordering a transition from the resume mode to the normal mode and outputs a delayed resume control signal delayed from the inputted resume control signal to a next-stage memory module.

8. The semiconductor device according to claim 7,
wherein the each first memory module comprises a control circuit including inverters of plural stages to which, in the normal mode, a first control signal for controlling a constituent element of the each memory module is inputted and which generate, by delaying the inputted first control signal, a second control signal for controlling another constituent element of the each memory module and to which, in the resume mode, the resume control signal is inputted and which generate, by delaying the inputted resume control signal, an intermediate signal, and wherein the delay circuit includes inverters of plural stages to which the intermediate signal is inputted from the plural-stage inverters included in the control circuit and which generate, by delaying the inputted intermediate signal, a resume control signal to be outputted to the next-stage memory module.

* * * * *